(12) United States Patent
Miller

(10) Patent No.: US 6,998,863 B1
(45) Date of Patent: Feb. 14, 2006

(54) ARRANGEMENT FOR PROVIDING ELECTRICAL CONNECTIONS TO PIN ELECTRONICS CARDS IN TEST HEAD

(75) Inventor: Wayne H. Miller, Los Altos, CA (US)

(73) Assignee: Credence Systems Corporation, Milpitas, CA (US)

(*) Notice: Subject to any disclaimer, the term of this patent is extended or adjusted under 35 U.S.C. 154(b) by 15 days.

(21) Appl. No.: 10/877,478

(22) Filed: Jun. 25, 2004

(51) Int. Cl.
*G01R 31/02* (2006.01)

(52) U.S. Cl. ............... 324/758; 324/754; 324/765; 324/158.1

(58) Field of Classification Search ............ None
See application file for complete search history.

(56) References Cited

U.S. PATENT DOCUMENTS

| | | | | |
|---|---|---|---|---|
| 5,594,357 A | * | 1/1997 | Nakajima | 324/758 |
| 6,448,797 B1 | * | 9/2002 | Holt et al. | 324/758 |
| 6,788,079 B1 | * | 9/2004 | Cheng | 324/754 |

* cited by examiner

*Primary Examiner*—Nestor Ramirez
*Assistant Examiner*—Jimmy Nguyen
(74) *Attorney, Agent, or Firm*—John Smith-Hill; Smith-Hill and Bedell

(57) ABSTRACT

A test head for a semiconductor integrated circuit tester, the test head includes a housing, a backplane structure attached to the housing in a manner permitting pivotal movement of the backplane structure relative to the housing, and a latch mechanism for forcing the backplane structure towards its closed position. The latch mechanism includes a cam follower that projects from the backplane structure in a direction perpendicular to the axis of pivotal movement of the backplane structure, a cam plate that is attached to the housing and is moveable relative to the housing and is formed with a cam slot for receiving the cam follower, and a drive mechanism effective to drive the cam plate to move relative to the housing. In the event that the cam follower is located in the working region of the cam slot, movement of the cam member in one direction urges the backplane structure towards the closed position and movement in the opposite direction urges the backplane structure away from the closed position.

12 Claims, 4 Drawing Sheets

ARRANGEMENT FOR PROVIDING ELECTRICAL CONNECTIONS TO PIN ELECTRONICS CARDS IN TEST HEAD

BACKGROUND OF THE INVENTION

This invention relates to an arrangement for providing electrical connections to pin electronics cards in a test head.

When a conventional semiconductor integrated circuit tester is used in conjunction with a wafer prober, the test head of the tester is typically placed directly above the wafer prober for sequentially testing wafers that are delivered to the test head from below. The test head houses pin electronics on rectangular pin electronics cards, and the pin electronics cards are disposed so that each card lies in a vertical plane and the edges of the cards are vertical and horizontal. Each card has terminals distributed along its lower edge and these terminals are connected to a probe card through a device interface board. When a wafer is positioned for testing, the wafer prober lifts the wafer and contact pads on the upper surface of the wafer engage probe needles that project downwards from the probe card.

For compactness, the pin electronics cards may be positioned in two rows. The cards are arranged in pairs, one card of the pair in each row.

The pin electronics cards are electrically connected at their upper edges to a backplane structure including conductors that provide electrical operating power and test data to the pin electronics circuits. The connections between the pin electronics cards and the backplane structure should be releasable in order to facilitate replacement of a defective pin electronics card or upgrade of a pin electronics card.

Since the backplane structure is normally rigid, in order to engage or disengage a connection between a pin electronics card and the backplane structure it is necessary that the connections between all the pin electronics cards and the backplane structure be engaged and disengaged simultaneously. A tester might have several thousand pin electronics circuits. Therefore, it can be difficult to supply the force that is necessary for simultaneous engagement or disengagement of the pin electronics cards.

SUMMARY OF THE INVENTION

In accordance with a first aspect of the invention there is provided a test head for a semiconductor integrated circuit tester, the test head comprising a housing including guide elements for positioning a plurality of pin electronics cards in the housing, a backplane structure attached to the housing in a manner permitting pivotal movement of the backplane structure relative to the housing about an axis of pivotal movement between an open position, in which the backplane structure affords access to the interior of the housing, and a closed position, the backplane structure having a proximal edge and a distal edge, wherein the proximal edge of the backplane structure is closer than the distal edge to the axis of pivotal movement, and a latch mechanism for forcing the backplane structure towards the closed position from an engagement position that is between the open position and the closed position, wherein the latch mechanism comprises a cam follower that projects from the backplane structure at the distal edge thereof in a direction substantially perpendicular to the axis of pivotal movement of the backplane structure, a cam member that is attached to the housing and is moveable relative to the housing, the cam member being formed with a cam slot including an entrance region for receiving the cam follower as the backplane structure approaches the engagement position and also including a working region, and a drive mechanism effective to drive the cam plate to move relative to the housing, the cam slot being configured such that in the event that the cam follower is located in the working region of the cam slot, movement of the cam member in one direction urges the backplane structure towards the closed position and movement in the opposite direction urges the backplane structure towards the engagement position.

In accordance with a second aspect of the invention there is provided a test head for a semiconductor integrated circuit tester, the test head comprising a plurality of pin electronics cards each having an interconnect edge, a housing including guide elements for positioning the pin electronics cards in the housing with the interconnect edge presented towards an opening of the housing, a backplane structure attached to the housing in a manner permitting pivotal movement of the backplane structure relative to the housing about an axis of pivotal movement between an open position, in which the backplane structure affords access to the interior of the housing, and a closed position, the backplane structure having a proximal edge and a distal edge, wherein the proximal edge of the backplane structure is closer than the distal edge to the axis of pivotal movement of the backplane structure, a plurality of edge connectors each including first and second complementary members, the first members of the edge connectors being attached to the pin electronics cards respectively at the interconnect edges thereof and the second members of the edge connectors being attached to the backplane structure, the first and second members of each edge connector being fully engaged when the backplane structure is in the closed position, and a latch mechanism for forcing the backplane structure towards the closed position from an engagement position that is between the open position and the closed position.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
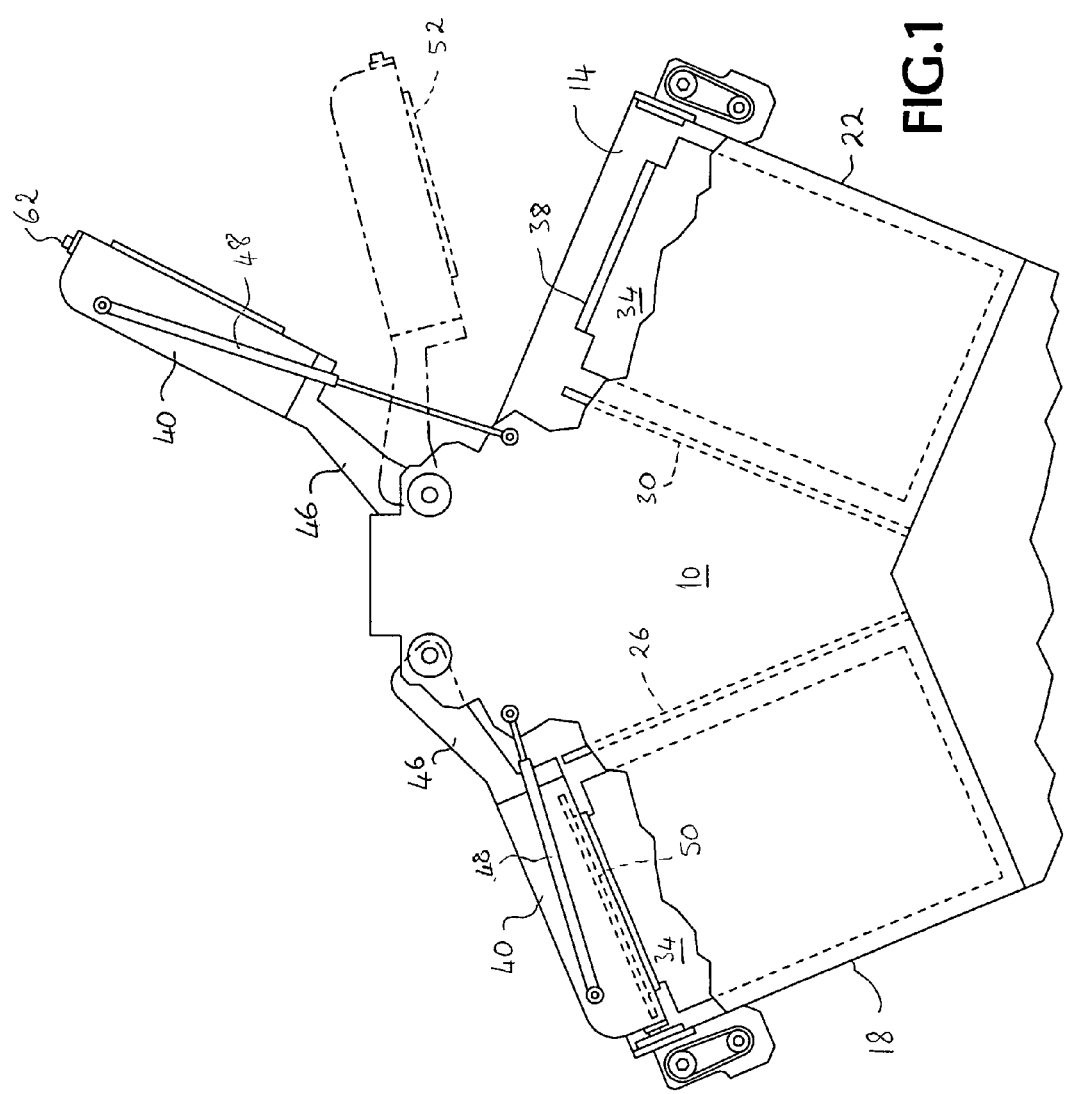
FIG. 1 is a cutaway partial end view of a test head embodying the present invention.

The test head shown in FIG. 1 comprises a housing having two vertical end walls 10, 14 and two exterior side walls 18, 22. The two side walls converge in the downward direction. The housing has two interior walls 26, 30 that are in spaced, parallel relationship with the side walls 18, 22 respectively. The two pairs of walls 18, 26 and 22, 30 define respective compartments. Each of the walls 18, 22, 26, 30 is provided with guides (not shown) for receiving up to eighteen pin electronics cards 34. Thus, each pair of walls provides a card cage for up to eighteen cards. Each pin electronics card is disposed in a vertical plane. Abutment means (not shown) are provided for positively preventing downward movement of the cards when they have been installed in the guides. Each card has a releasable retention latch (not shown) for holding the card in position when it has been installed. Each card is provided at its upper edge with the receptacle 38 of a multi-pin connector. The test head is used in conjunction with a server (not shown) for supplying test data to, and receiving test data from, the pin electronics cards.

The test head also comprises two covers 40 for the two compartments respectively. Each cover is generally rectangular and is pivotally mounted to the two end walls 10, 14 by extension arms 46 such that the cover can be pivoted about a horizontal pivot axis between an open position, in which it affords access to the interior of the compartment, and a closed position in which it is disposed substantially parallel to the upper edges of the cards in the particular compartment. The pivot axis is perpendicular to the end walls 10, 14 of the housing. Each cover has a proximal edge that is nearer the pivot axis of the cover and a distal edge that is farther from the pivot axis of the cover. When the cover is open, its weight is partially supported by an air spring 48.

The two covers incorporate respective segments of a backplane structure of the test head. Thus, each cover includes a backplane circuit board 50 and shrouded pin headers 52 that are attached to the backplane circuit board for engaging the receptacles 38 of the pin electronics cards held in the compartment when the cover is in the closed position. Each backplane circuit board 50 includes conductors (not shown) that are connected to the pins of the pin headers 52 and are in turn connected by cables (not shown) to the server for passing test data between the pin electronics cards and the server. The backplane structure also includes power supply connectors for supplying operating power to the pin electronics circuits.

Each pin electronics card typically supports 96 pin electronic circuits, each of which can be operated selectively to supply a stimulus signal to, or receive a response signal from, a single pad of the DUT, and requires 550 pins for interfacing to the backplane circuit board. It will therefore be appreciated that a substantial force is required in order to engage all the pin headers with the respective receptacles, or, in the alternative, to disengage the pin headers from the receptacles.

Each cover 40 has three cam followers 62 at its distal edge. Each cam follower 62 is implemented by a roller mounted on a stub shaft that projects from the distal edge of the cover.

Figure 2:
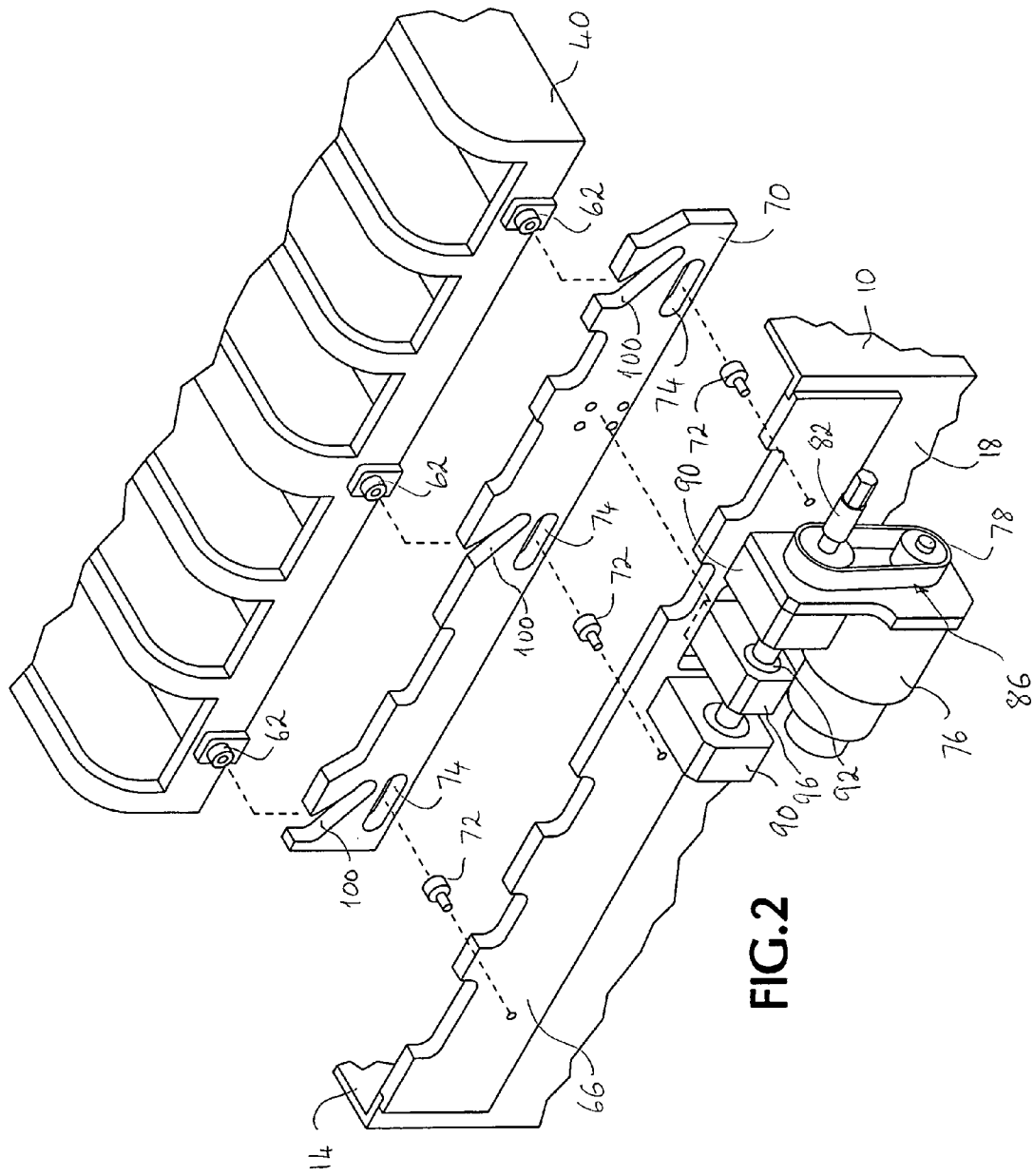
FIG. 2 is an exploded perspective view of the latch mechanism of the test head shown in FIG. 1.
Figure 3:
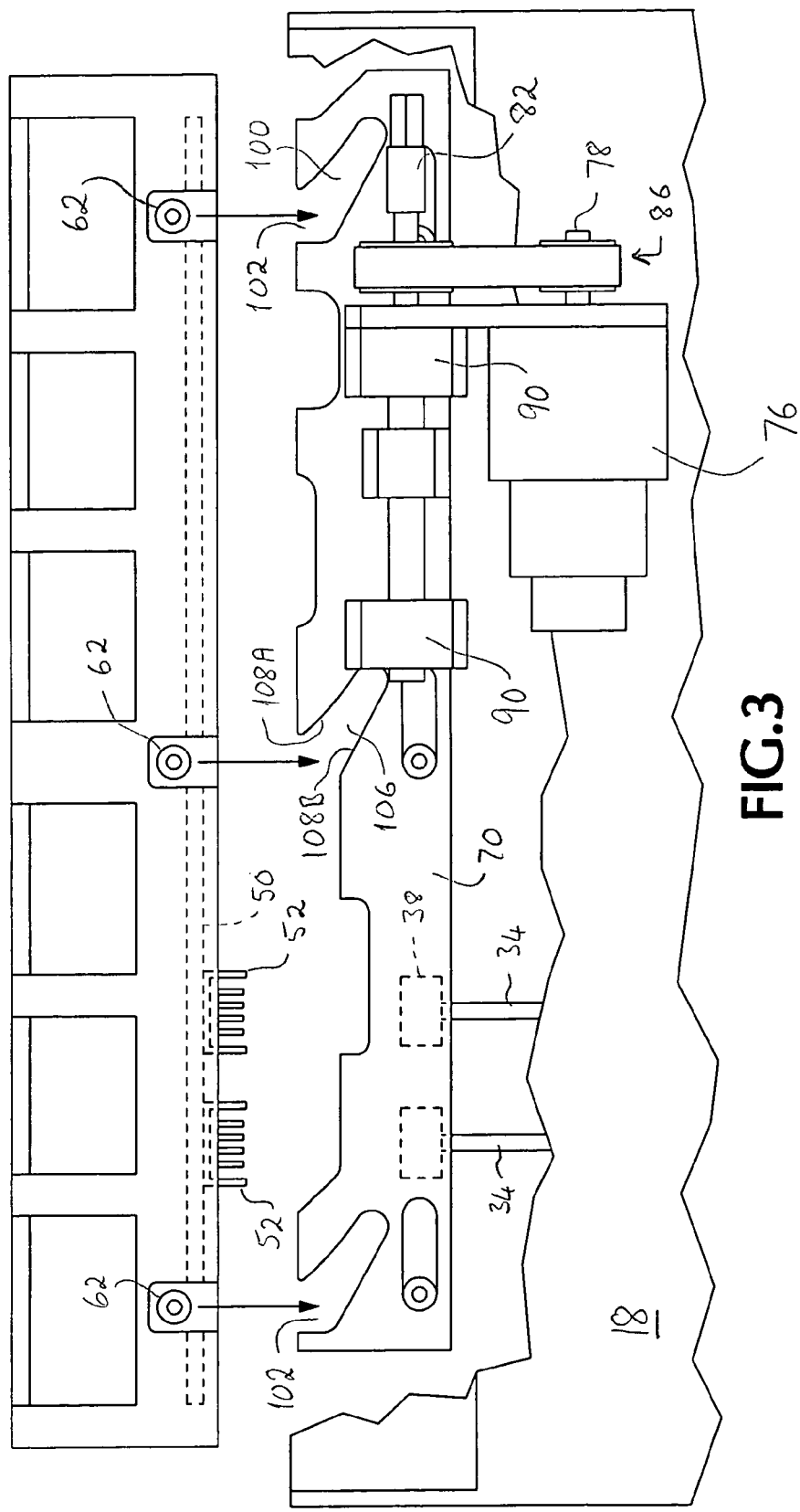
FIG. 3 is a side view of the latch mechanism when the latch mechanism is disengaged.
Figure 4:
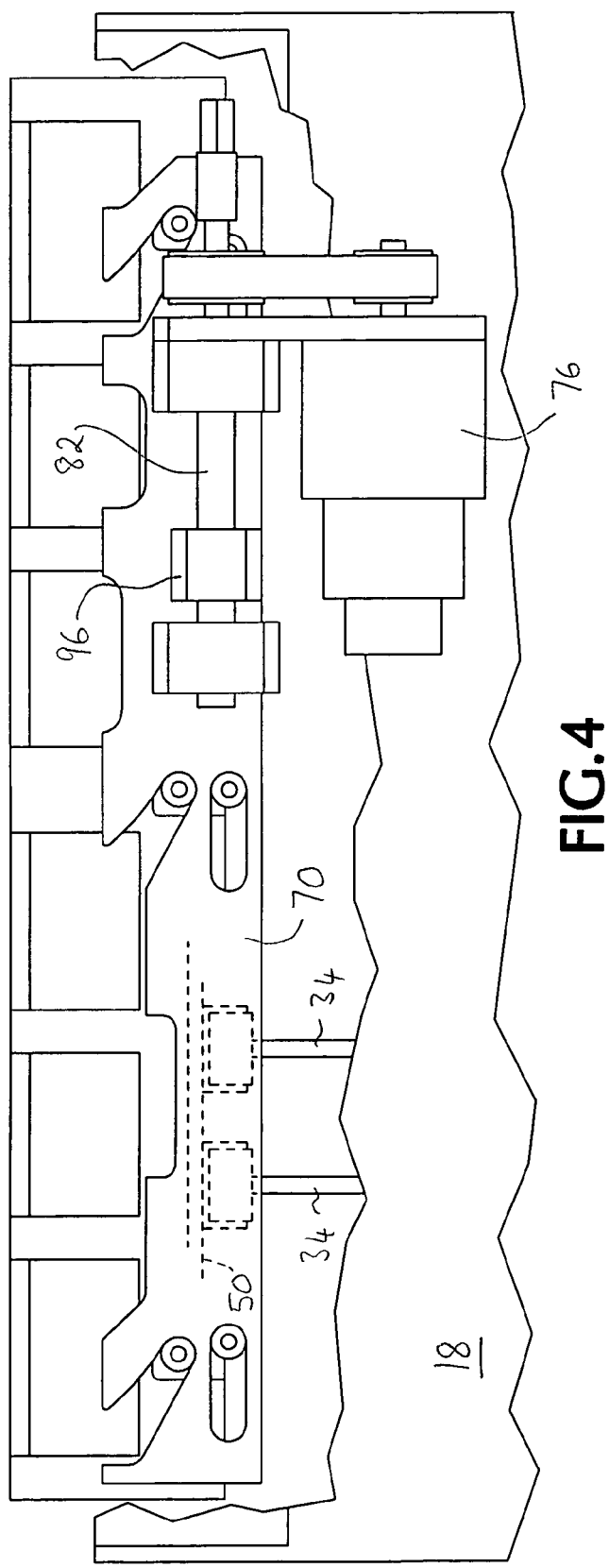
FIG. 4 is a view similar to FIG. 3 showing the latch mechanism when it is engaged.

Referring to FIGS. 2–4, a guide plate 66 is rigidly attached to the side wall 18 and a cam plate 70 is located inboard of the guide plate 66. The cam plate 70 is attached to the guide plate by fasteners (not shown) that hold the cam plate parallel to the guide plate and at a fixed distance from the guide plate but allow movement of the cam plate relative to the guide plate. Movement of the cam plate relative to the guide plate is constrained by rollers 72 that are attached to the guide plate and run in slots 74 that are formed in the cam plate so that the cam plate is able to move parallel to the axis of pivotal movement of the cover 40. An air motor 76 is attached to the guide plate 66 and drives an output shaft 78 for rotation about an axis that is parallel to the pivot axis of the cover 40 but is not able to move otherwise relative to the guide plate. A lead screw 82 is parallel to the shaft 78 and is connected drivingly thereto by a pulley and belt arrangement 86. The lead screw 82 is supported in support brackets 90 that are secured to the guide plate 66. The support brackets 90 permit rotation of the lead screw but restrain the lead screw against axial linear movement. The lead screw is in threaded engagement with a nut 92 that is mounted in a bracket 96 that is secured to the cam plate 70. The bracket 96 holds the nut 92 against movement relative to the cam plate.

A controller (not shown) prevents operation of the air motor 76 when the cover 40 is in the open position.

Limit switches (not shown) establish a range of linear movement of the cam plate 70 when driven by the motor 76. Thus, when the motor is driven in one direction, the cam plate is driven from right to left in FIGS. 3 and 4 and conversely when the motor is driven in the opposite direction, the cam plate is driven from left to right.

The cam plate is formed with three slots 100 each having an entrance region 102 and a working region 106 bounded between upper and lower surfaces 108A and 108B. When the cam plate is at the right limit position, the entrance regions 102 of the cam slots are positioned to receive the followers 62 respectively. Let us assume that the followers 62 are in fact located in the entrance regions 102 of the cam slots 100. In this position, the pin headers 52 of the backplane circuit board are substantially fully disengaged from the receptacles 38 of the pin electronics cards and an operator can lift the cover to its open position, aided by the air springs 48. When the cover is in its fully open position, the air springs are able to support the weight of the cover. The operator can then remove a defective pin electronics card from its compartment and replace it with an operative card. The operator lowers the cover until the followers 62 are located in the entrance regions 102 of the respective cam slots 100, at which point the pin headers of the backplane are in contact with the receptacles of the pin electronics cards but are not firmly engaged. The operator actuates the air motor 76, which drives the lead screw 82 in a direction to force the cam plate 70 to the left. As the cam plate moves to the left, the upper surface 108A of the working region 106 of each cam slot engages the follower 62 in the cam slot, and since the surface 108A is inclined downward and the cam plate is restrained against movement otherwise than parallel to the pivot axis of the cover, the cam plate forces the follower 62 downwards until the follower reaches the end of the working region 106 of the cam slot. In this manner, the cover 40 is forced to its fully closed position, in which the pin headers are fully engaged with the receptacles of the pin electronics cards.

When the cover 40 is in its fully closed position, the controller permits the motor 76 to drive the lead screw 82 in a direction to force the cam plate 70 to the right. As the cam plate moves to the right, the lower surface 108B of the working region 106 of each cam slot acts against the follower 62 in the cam slot, and since the surface 108B is inclined upward and the cam plate is restrained against movement otherwise than parallel to the pivot axis of the cover, the movement of the cam plate forces the cam follower upwards until the follower reaches the entrance region 102 of the cam slot, at which point the pin headers of the backplane circuit board are substantially fully disengaged from the receptacles of the pin electronics cards. The operator can lift the cover to its open position, aided by the air springs.

Ideally, the pin headers 52 would move linearly relative to the receptacles 38 during engagement with and disengagement from the receptacles so that the pin headers 52 will remain in the same orientation relative to the receptacle 38, but since the cover 40 is mounted pivotally to the housing, the orientation of the pin headers 52 relative to the receptacles 38 of the pin electronics cards will in fact change as the cover is driven by the cam plate 70 between the engagement position and the fully closed position. However, because the pivot axis is spaced from the receptacle by a distance of about 25 cm, the pin headers turn through an angle of only 20° during movement of the cover between the engagement position and the fully closed position, which is tolerable.

Use of a single rigid cam plate to drive all three followers 62 ensures that the three followers move together and at the same speed, and therefore any tendency for the cover to twist during movement between the engagement position and the fully closed position, such as might occur if the followers were driven by different respective cam plates, is avoided.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A test head for a semiconductor integrated circuit tester, the test head comprising:
    a housing including guide elements for positioning a plurality of pin electronics cards in the housing,
    a backplane structure attached to the housing in a manner permitting pivotal movement of the backplane structure relative to the housing about an axis of pivotal movement between an open position, in which the backplane structure affords access to the interior of the housing, and a closed position, the backplane structure having a proximal edge and a distal edge, wherein the proximal edge of the backplane structure is closer than the distal edge to the axis of pivotal movement, and
    a latch mechanism for forcing the backplane structure towards the closed position from an engagement position that is between the open position and the closed position, wherein the latch mechanism comprises:
        a cam follower that projects from the backplane structure at the distal edge thereof in a direction substantially perpendicular to the axis of pivotal movement of the backplane structure,
        a cam member that is attached to the housing and is moveable relative to the housing, the cam member being formed with a cam slot including an entrance region for receiving the cam follower as the backplane structure approaches the engagement position and also including a working region, and
        a drive mechanism effective to drive the cam plate to move relative to the housing, the cam slot being configured such that in the event that the cam follower is located in the working region of the cam slot, movement of the cam member in one direction urges the backplane structure towards the closed position and movement in the opposite direction urges the backplane structure towards the engagement position.

2. A test head according to claim 1, wherein the cam member comprises a cam plate that is moveable linearly relative to the housing along a path parallel to the axis of pivotal movement of the cover and is restrained against movement perpendicular to said path, and the working region of the cam slot is inclined relative to said path.

3. A test head according to claim 2, wherein the drive mechanism comprises a lead screw that is rotatable about an axis parallel to the pivot axis and is restrained against linear movement relative to the housing, a nut that is in threaded engagement with the lead screw and is captive relative to the cam plate, and a motor coupled drivingly to the lead screw for rotating the lead screw.

4. A test head for a semiconductor integrated circuit tester, the test head comprising:
    a plurality of pin electronics cards each having an interconnect edge,
    a housing including guide elements for positioning the pin electronics cards in the housing with the interconnect edge presented towards an opening of the housing,
    a backplane structure attached to the housing in a manner permitting pivotal movement of the backplane structure relative to the housing about an axis of pivotal movement between an open position, in which the backplane structure affords access to the interior of the housing, and a closed position, the backplane structure having a proximal edge and a distal edge, wherein the proximal edge of the backplane structure is closer than the distal edge to the axis of pivotal movement of the backplane structure,
    a plurality of edge connectors each including first and second complementary members, the first members of the edge connectors being attached to the pin electronics cards respectively at the interconnect edges thereof and the second members of the edge connectors being attached to the backplane structure, the first and second members of each edge connector being fully engaged when the backplane structure is in the closed position, and
    a latch mechanism for forcing the backplane structure towards the closed position from an engagement position that is between the open position and the closed position.

5. A test head according to claim 4, wherein the pin electronics cards are substantially planar and are disposed parallel to each other, and the axis of pivotal movement of the backplane structure is perpendicular to the pin electronics cards.

6. A test head according to claim 5, wherein the axis of pivotal movement is spaced from the pin electronics cards along a displacement axis that is substantially parallel to the interconnect edge of the pin electronics cards.

7. A test head according to claim 4, wherein the cam member comprises a cam plate that is moveable linearly relative to the housing along a path parallel to the axis of pivotal movement of the cover and is restrained against movement perpendicular to said path, and the working region of the cam slot is inclined relative to said path.

8. A test head according to claim 7, wherein the drive mechanism comprises a lead screw that is rotatable about an axis parallel to the pivot axis and is restrained against linear movement relative to the housing, a nut that is in threaded engagement with the lead screw and is captive relative to the cam plate, and a motor coupled drivingly to the lead screw for rotating the lead screw.

9. A test head according to claim 4, wherein the housing defines first and second compartments and includes first guide elements for positioning a first group of pin electronics cards in the first compartment and second guide elements for positioning a second group of pin electronics cards in the second compartment, the first and second guide elements defining positions for the first and second groups of pin electronics cards such that the first group of pin electronics cards.

10. A test head according to claim 9, comprising:
a first backplane structure attached to the housing in a manner permitting pivotal movement of the first backplane structure relative to the housing about an axis of pivotal movement between an open position, in which the backplane structure affords access to the first compartment, and a closed position, in which the first backplane structure engages the pin electronics cards in the interior of the first compartment,
a second backplane structure attached to the housing in a manner permitting pivotal movement of the second backplane structure relative to the housing about an axis of pivotal movement between an open position, in which the second backplane structure affords access to the interior of the second compartment, and a closed position, in which the second backplane structure engages the pin electronics cards in the second compartment.

11. A test head according to claim 10, wherein the first and second compartments have respective openings for insertion of pin electronics cards into, and removal of pin electronics cards from, the first and second compartments respectively, the pin electronics cards are disposed substantially vertically, the axes of pivotal movement of the first and second backplane structures are substantially horizontal, and the axes of pivotal movement of the first and second backplane structures are located horizontally between the opening of the first compartment and the opening of the second compartment.

12. A test head according to claim 11, wherein the axes of pivotal movement of the first and second backplane structures are substantially perpendicular to the pin electronics cards.

* * * * *